(12) United States Patent
Schmitt et al.

(10) Patent No.: US 11,626,643 B2
(45) Date of Patent: Apr. 11, 2023

(54) BATTERY AND USE OF SUCH A BATTERY

(71) Applicant: Robert Bosch GmbH, Stuttgart (DE)

(72) Inventors: Markus Schmitt, Tamm (DE);
Benjamin Kopp, Remseck Am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 150 days.

(21) Appl. No.: 17/064,631

(22) Filed: Oct. 7, 2020

(65) Prior Publication Data
US 2021/0104714 A1    Apr. 8, 2021

(30) Foreign Application Priority Data
Oct. 7, 2019    (DE) .......................... 102019215338.0

(51) Int. Cl.
*H01M 50/20* (2021.01)
*H01M 10/63* (2014.01)
*H01M 10/6567* (2014.01)
*H01M 10/42* (2006.01)
*H01M 10/6568* (2014.01)
(Continued)

(52) U.S. Cl.
CPC ......... *H01M 50/20* (2021.01); *H01M 10/425* (2013.01); *H01M 10/63* (2015.04); *H01M 10/6563* (2015.04); *H01M 10/6567* (2015.04); *H01M 10/6568* (2015.04); *H01M 10/613* (2015.04); *H05K 7/20145* (2013.01); *H05K 7/20272* (2013.01)

(58) Field of Classification Search
None
See application file for complete search history.

(56) References Cited

U.S. PATENT DOCUMENTS

2010/0015512 A1* 1/2010 Inoue .................. H01M 10/425
361/714
2010/0099015 A1* 4/2010 Kawai ............... H01M 10/6568
429/62
(Continued)

FOREIGN PATENT DOCUMENTS

CN    101924259 A    12/2010
DE    102014007638 A1    11/2015
(Continued)

OTHER PUBLICATIONS

Introduction to DC-DC Converters (Year: 2022).*

*Primary Examiner* — Lisa S Park
(74) *Attorney, Agent, or Firm* — Michael Best & Friedrich LLP (57) ABSTRACT

A battery wherein a first housing element (2) forms a first temperature-control structure (101) on a side averted from the interior space (5), wherein a second housing element (3) forms a second temperature-control structure (102) on a side averted from the interior space (5), and a cover element (100) is connected to the second housing element (3) such that the cover element (100) delimits a temperature-control fluid receptacle (112), which can be flowed through by temperature-control fluid, and the second temperature-control structure (102) is formed such that it can be flowed around by the temperature-control fluid, wherein the cover element (100) is formed in a planar configuration from a metal or has a deformed portion for accommodating a second element (9) of the battery controller.

18 Claims, 5 Drawing Sheets

(51) Int. Cl.
  *H01M 10/6563* (2014.01)
  *H05K 7/20* (2006.01)
  *H01M 10/613* (2014.01)

(56) References Cited

U.S. PATENT DOCUMENTS

| | | | | |
|---|---|---|---|---|
| 2011/0104521 | A1* | 5/2011 | Kishimoto | B60L 50/64 |
| | | | | 429/7 |
| 2013/0209838 | A1* | 8/2013 | Manna | H01M 10/6567 |
| | | | | 429/7 |
| 2014/0178719 | A1* | 6/2014 | Storc | B60L 53/14 |
| | | | | 429/82 |
| 2014/0295224 | A1* | 10/2014 | Inoue | H01M 10/613 |
| | | | | 429/62 |
| 2017/0144754 | A1* | 5/2017 | Limvorapun | B60L 50/72 |
| 2017/0179551 | A1 | 6/2017 | Shepard et al. | |
| 2018/0062226 | A1* | 3/2018 | Raiser | H01M 10/6554 |
| 2018/0191173 | A1* | 7/2018 | James | H02J 7/0014 |
| 2018/0358664 | A1* | 12/2018 | Zhang | H01M 10/6561 |
| 2019/0394901 | A1* | 12/2019 | Esders | H05K 7/20218 |
| 2020/0243931 | A1* | 7/2020 | Sakurai | H01M 50/291 |

FOREIGN PATENT DOCUMENTS

| | | |
|---|---|---|
| DE | 102016104175 A1 | 9/2017 |
| DE | 102018100394 A1 | 7/2019 |
| EP | 2908377 A1 | 8/2015 |
| EP | 3331055 A1 | 6/2018 |
| EP | 3726612 A1 | 10/2020 |

\* cited by examiner

BATTERY AND USE OF SUCH A BATTERY

BACKGROUND OF THE INVENTION

The invention relates to a battery and the use of such a battery.

It is known from the prior art that a battery module has a multiplicity of individual battery cells which each have a positive voltage terminal and a negative voltage terminal, wherein, for electrically conductive series and/or parallel connection of the multiplicity of battery cells to one another, the respective voltage terminals are connected to one another in electrically conductive fashion and can thus be interconnected to form the battery module. Battery modules in turn are interconnected to form batteries or to form battery systems. Owing to a large number of possible different vehicle structural spaces, variable module sizes are sought in order to be able to optimally utilize the available structural space.

Furthermore, the battery cells of a battery module, for example lithium-ion battery cells or lithium-polymer battery cells, warm up during operation, as a result of chemical reaction processes, owing to their electrical resistance during an output of power or an intake of power. In particular in the case of a relatively fast output of power or intake of power, these processes are comparably pronounced. The more powerful a battery or a battery module is, the more pronounced is the warming that occurs, and, in association with this, the more pronounced are the demands for an efficient temperature-control system. In order to increase the safety of a battery module and also ensure the performance of the battery cells, the battery cells of a battery module must be both heated and cooled in order to be able to operate these as far as possible in a particular temperature range, such that, for example, increased aging behavior or a decomposition of the cell chemistry can be prevented. The battery cells must however predominantly be cooled.

For example, a temperature control means, that is to say heating or cooling means, of the battery may be formed by a liquid-type temperature control means with a water/glycol mixture. Here, said mixture is conducted through cooling plates arranged under the battery module. Here, the cooling plate may be connected to a corresponding component of a cooling circuit.

SUMMARY OF THE INVENTION

A battery according to the invention offers the advantage that temperature control of individual components of the battery can be adapted to the respective requirements of said components. In particular through a formation of two temperature-control fluid receptacles as temperature-control spaces, the demands on the temperature control of a multiplicity of battery cells and of components of the power electronics can be adapted and optimized separately from one another. An optimization of the temperature control or cooling of the multiplicity of battery cells is thus possible separately from an optimization of the temperature control or cooling of the components of the power electronics.

For this purpose, according to the invention, a battery is provided. The battery comprises a first housing element and a second housing element. The first housing element and the second housing element together form an interior space for accommodating a battery module. Here, a multiplicity of battery cells of the battery module is arranged in the interior space. The multiplicity of battery cells is connected in electrically conductive fashion to one another in series and/or in parallel. In particular, the battery cells are in this case of prismatic form. The multiplicity of battery cells is preferably in the form of lithium-ion battery cells.

A first element of a battery controller is furthermore arranged in the interior space.

The first housing element forms a first temperature-control structure on a side averted from the interior space. In particular, the first temperature-control structure is furthermore formed on a side averted from the second housing element.

The second housing element forms a second temperature-control structure on a side averted from the interior space. In particular, the second temperature-control structure is furthermore formed on a side averted from the first housing element. Here, a cover element is connected to the second housing element such that the cover element delimits a temperature-control fluid receptacle which can be flowed through by temperature-control fluid. Furthermore, the second temperature-control structure is formed such that it can be flowed around by the temperature-control fluid.

Here, the cover element is formed in a planar configuration from a metal or has a deformed portion for accommodating a second element of the battery controller.

In particular, an embodiment according to the invention of the battery offers the advantage that efficient cooling of the individual components, for example of the multiplicity of battery cells and the components of the power electronics, is possible, because relatively short thermal paths are formed. At the same time, a compact form of the battery can be provided.

It is advantageous if the first element of the battery controller is arranged in thermally conductive contact against a side, facing toward the interior space, of the second housing element. In this way, reliable temperature control of the first element of the battery controller is possible. In particular, temperature control of the first element of the battery controller independently of the multiplicity of battery cells is possible. The temperature control of the first element of the battery controller may be influenced here by means of the design of the second temperature-control structure.

It is furthermore expedient if the second element of the battery controller is arranged in thermally conductive contact against a side, averted from the interior space and in particular from the second housing element, of the cover element. In this way, reliable temperature control of the second element of the battery controller is likewise possible. In particular, temperature control of the second element of the battery controller independently of the multiplicity of battery cells is possible. The temperature control of the second element of the battery controller may be influenced here by means of the design of the second temperature-control structure.

It is advantageous if the second element of the battery controller comprises at least one electrical component of the battery module and/or at least one electronic component of the battery module.

It is advantageous here if the electrical component of the battery module is a line. Lines are designed to conduct electrical current from one component to another component.

It is preferable if the electronic component of the battery module is a switch, a fuse element, a battery control system and/or a resistor. By means of such an arrangement of the electrical component and/or of the electronic component of the battery, it is possible to connect the multiplicity of battery cells of the battery module in electrically conductive fashion to one another in series and/or in parallel, and to control the battery module in open-loop and closed-loop fashion. Furthermore, reliable temperature control of these components is simultaneously possible.

According to a preferred aspect of the invention, the at least one electronic component is in this case integrated into a circuit board. In particular, the line may also be at least partially integrated into the circuit board. This offers the advantage of a comparably compact form, simple temperature control of which is furthermore likewise possible.

It is furthermore expedient if the first element of the battery controller is an electrical voltage converter, in particular a DC voltage converter. Furthermore, the electrical voltage converter or the DC voltage converter may be arranged on a further circuit board or integrated into a further circuit board.

Here, it is furthermore possible for a thermal compensation material, such as for example a thermally conductive adhesive, a so-called gap filler or a so-called thermal interface material (TIM), to be arranged between the electrical voltage converter or the DC voltage converter and the cover element. By means of a connection, for example by means of screws, of the electrical voltage converter to the cover element, reliable thermal conduction can be realized. Altogether, this results in a relatively short thermal path between a temperature-control fluid flowing through the temperature-control fluid receptacle of the second housing element and the electrical voltage converter or the DC voltage converter, with a thus comparably low thermal resistance.

The cover element is formed in a planar configuration from a metallic material or has a deformed portion for accommodating the first element of the battery controller. In particular, the cover element may in this case preferably be formed from a metallic metal sheet.

Here, the cover element may for example be connected in cohesive fashion, in particular by welding, to the second housing element. For this purpose, the second housing element may for example have an attachment region which is designed to be cohesively connected to the cover element. At this juncture, it is also pointed out that the cover element seals off the temperature-control fluid receptacle in fluid-tight fashion with respect to surroundings. In particular, such a seal can be formed by means of the cohesive connection of the cover element to the attachment region of the second housing element.

It is furthermore also possible that the cover element can be connected for example in positively locking fashion, in particular by means of screws, to the second housing element. For more reliable sealing, it is furthermore possible here for an additional sealing element to be arranged between the cover element and the second housing element.

A planar form of the cover element offers the advantage that a comparably extremely large thermal contact area for the attachment of the second element of the battery controller is formed.

A cover element with a deformed portion for accommodating the second element of the battery controller offers the advantage, for example, that a height, which can be flowed through by temperature-control fluid, of the temperature-control fluid receptacle can be correspondingly adapted, whereby it is possible to provide a design which is particularly optimized with regard to structural space. Furthermore, it is possible to provide that the first element of the battery controller is reliably accommodated by the deformed portion. At this juncture, it is also pointed out that, for example by means of the form with a bend angle, it is possible for a height of the temperature-control fluid receptacle to be configured to decrease in a flow direction or in a longitudinal direction of the temperature-control fluid receptacle.

It is also pointed out that the cover element is formed from a metallic material. Here, the metallic material may be selected from aluminum, copper or nickel. This offers the advantage of comparably high thermal conductivity.

In particular, it is possible here for a thermal compensation element, such as for example a thermally conductive adhesive, to be arranged between the second element of the battery controller and the cover element.

The multiplicity of battery cells is expediently arranged in thermally conductive contact with an inner side, arranged directly adjacent to the first temperature-control structure, of the interior space. In this way, temperature control of the multiplicity of battery cells is possible with altogether very high reliability. Furthermore, temperature control of the multiplicity of battery cells is thus possible for example independently of the first element of the battery controller and also independently of the second element of the battery controller. In particular, here, it is possible for a thermal compensation element, such as for example a thermally conductive adhesive, to be arranged between the multiplicity of battery cells and the inner side.

It is expedient if the first housing element and/or the second housing element are each formed as die-cast housings. In this way, it is possible to provide a mechanically comparably stable design. Furthermore, it is thus possible for regions which conduct temperature-control fluid to be formed within the die-cast components, such that it is possible to dispense with additional cooling plates, heating elements or temperature-control systems.

It is advantageous if the first housing element and the second housing element are connected to one another in fluid-tight form. In particular, for this purpose, a seal element is arranged between the first housing element and the second housing element. It is thus possible to provide an interior space, which is closed off in fluid-tight fashion, of the battery. In particular, it is possible in this way for the battery cells and the electrical voltage converter or the DC voltage converter to be protected against external influences.

According to a preferred aspect of the invention, the multiplicity of battery cells is in the form of prismatic battery cells. Prismatic battery cells in this case have a total of six side surfaces, which are arranged opposite one another, and parallel to one another, in pairs. Furthermore, mutually adjacently arranged side surfaces are arranged at right angles to one another. Altogether, through the use of prismatic battery cells in a battery according to the invention, it is possible for a compact battery to be provided.

It is expedient if a further cover element is arranged on the first housing element. In particular, the further cover element is arranged so as to be connected to the first housing element. Here, the further cover element and the first temperature-control structure jointly form a further temperature-control fluid receptacle which is formed such that it can be flowed through by temperature-control fluid. The further cover element in this case delimits the further temperature-control fluid receptacle in fluid-tight fashion with respect to surroundings. Furthermore, the first temperature-control structure is formed such that it can be flowed around by the temperature-control fluid. This offers the advantage that the first temperature-control structure can be adapted to the demands with regard to the temperature control of the multiplicity of battery cells which are accommodated in the interior space. This adaptation is possible here independently, for example, of the cooling of the electrical component and/or of the electronic component and independently of the cooling of the electrical voltage converter or of the DC voltage converter. For example, the first temperature-control structure may comprise flow-disrupting elements or flow-guiding elements, which are arranged only where they can positively influence the temperature control on the basis of demanded temperatures of the multiplicity of battery cells. Furthermore, the remaining regions of the further temperature-control fluid receptacle can be optimized with regard to the flow and the pressure loss. In particular, it is possible to dispense with a compromise between temperature control of the multiplicity of battery cells and the electrical component and/or the electronic component and the electrical voltage converter, because mutually independent temperature control of these components is possible.

The further cover element is in this case preferably cohesively connected to the first housing element. In particular, the further cover element may be welded or brazed to the first housing element. Furthermore, a second seal element may be arranged between the first housing element and the cover element.

It is also preferably possible for the further cover element to be formed by the first housing element.

Altogether, this offers the advantage that, by means of such a design, it is possible to prevent temperature-control fluid from passing into the interior space to the multiplicity of battery cells in the event of defects or leaks of the first temperature-control space.

The battery advantageously comprises a first connector and a second connector. The first connector is in this case designed for feeding temperature-control fluid to the battery and the second connector is in this case designed for discharging temperature-control fluid from the battery.

In particular, the first connector and the second connector form an interface to a motor vehicle.

According to a first aspect, the temperature-control fluid can flow in series through the temperature-control fluid receptacle and the further temperature-control fluid receptacle. Here, the temperature-control fluid flows for example firstly through the temperature-control fluid receptacle and subsequently through the further temperature-control fluid receptacle or, conversely, firstly through the further temperature-control fluid receptacle and subsequently through the temperature-control fluid receptacle.

According to a second aspect of the invention, the temperature-control fluid can flow in parallel through the temperature-control fluid receptacle and the further temperature-control fluid receptacle. Here, the temperature-control fluid is, after flowing through the first connector, divided into a first partial stream, which flows through the temperature-control fluid receptacle, and a second partial stream, which flows through the further temperature-control fluid receptacle. The first partial stream and the second partial stream, after flowing through the respective temperature-control fluid receptacle, are merged again and conducted out of the battery by means of the second connector.

In this way, it is altogether possible, for example, for the pressure loss to be minimized. Furthermore, in this way, it is for example also possible for the heat transfer to be improved.

In particular, here, the first housing element and/or second housing element each have a temperature-control fluid inlet and a temperature-control fluid outlet. The respective temperature-control fluid inlet serves for admitting temperature-control fluid into the temperature-control fluid receptacle and the further temperature-control fluid receptacle, and the respective temperature-control fluid outlet serves for discharging temperature-control fluid out of the temperature-control fluid receptacle and the further temperature-control fluid receptacle. Furthermore, a temperature-control fluid outlet and a temperature-control fluid inlet may also be connected to one another in fluid-conducting fashion, such that temperature-control fluid can flow between the temperature-control fluid receptacle and the further temperature-control fluid receptacle or vice versa.

For example, the temperature-control fluid inlet of the first housing element may form the first connector of the battery, such that temperature-control fluid can flow in through this. Furthermore, the temperature-control fluid outlet of the first housing element may for example be connected in fluid-conducting fashion to the temperature-control fluid inlet of the second housing element, such that temperature-control fluid can flow firstly through the further temperature-control fluid receptacle and subsequently through the temperature-control fluid receptacle, that is to say a series throughflow is realized. Furthermore, the temperature-control fluid outlet of the second housing element may for example form the second connector of the battery, such that temperature-control fluid can, through this, exit the temperature-control fluid receptacle.

For example, the temperature-control fluid inlet of the second housing element may form the first connector of the battery, such that temperature-control fluid can, through this, flow into the temperature-control fluid receptacle. Furthermore, the temperature-control fluid outlet of the second housing element may for example be connected in fluid-conducting fashion to the temperature-control fluid inlet of the first housing element, such that temperature-control fluid can flow firstly through the temperature-control fluid receptacle and subsequently through the further temperature-control fluid receptacle, that is to say a series throughflow is realized.

It is pointed out at this juncture that such a connection between the temperature-control fluid inlet of one housing element and the temperature-control fluid outlet of the other housing element is preferably formed within the first housing element and/or within the second housing element, which are furthermore particularly preferably each formed as die-cast housings.

It is expedient if the first temperature-control structure and/or the second temperature-control structure are each formed as flow-guiding elements, as flow-disrupting elements or as flow-delimiting means.

In particular, the first temperature-control structure and/or the second temperature-control structure may each be formed by the corresponding die-cast housing.

At this juncture, flow-guiding elements are to be understood to mean elements which are arranged within a respective temperature-control space and which serve for diverting a flow without a comparable increase in turbulence.

At this juncture, flow-disrupting elements are to be understood to mean elements which are arranged within a respective temperature-control space and which serve for increasing the turbulence of a flow, in particular causing a change from a laminar to a turbulent flow, in order, at any rate, to effect an improved dissipation of heat.

At this juncture, flow-delimiting means are to be understood to mean elements which mechanically delimit the respective temperature-control space.

It is also advantageous if the electrical component and/or the electronic component are connected in thermally conductive fashion to a side, averted from the interior space, of the cover element. In particular, here, a thermal compensation element, such as for example a thermally conductive adhesive or a so-called thermal interface material (TIM), may be arranged between the electrical component and/or the electronic component and the cover element.

For example, reliable thermal conduction can be realized by means of a connection of a circuit board, which comprises the electronic component, to the cover element, for example also by means of screws or by means of a cohesive connection. Altogether, this results in a comparably short thermal path between a temperature-control fluid flowing through the temperature-control fluid receptacle and the circuit board, with a thus comparably low thermal resistance.

The present invention also relates to the use of an above-described battery according to the invention for the temperature control, and in particular for the cooling, of the multiplicity of battery cells, of the electrical component and/or of the electronic component and/or of the electrical voltage converter, wherein a temperature-control fluid in the form of temperature-control liquid or temperature-control gas flows around the first temperature-control structure or wherein the temperature-control fluid in the form of temperature-control liquid flows through the temperature-control fluid receptacle.

In particular, the battery is operated such that the temperature of the battery cells, which are preferably in the form of lithium-ion battery cells, lies below a temperature of 40° C. and preferably below a temperature of 35° C. In this way, adequate thermal conditioning of the battery can be realized, whereby the battery cells can be operated in a thermally non-critical state, such that, for example, aging synchronization of the battery cells can be realized, because, in particular, a temperature gradient from battery cell to battery cell is comparably low.

BRIEF DESCRIPTION OF THE DRAWINGS

Exemplary embodiments of the invention are illustrated in the drawings and will be discussed in more detail in the following description.

In the drawings.

DETAILED DESCRIPTION

Figure 1:
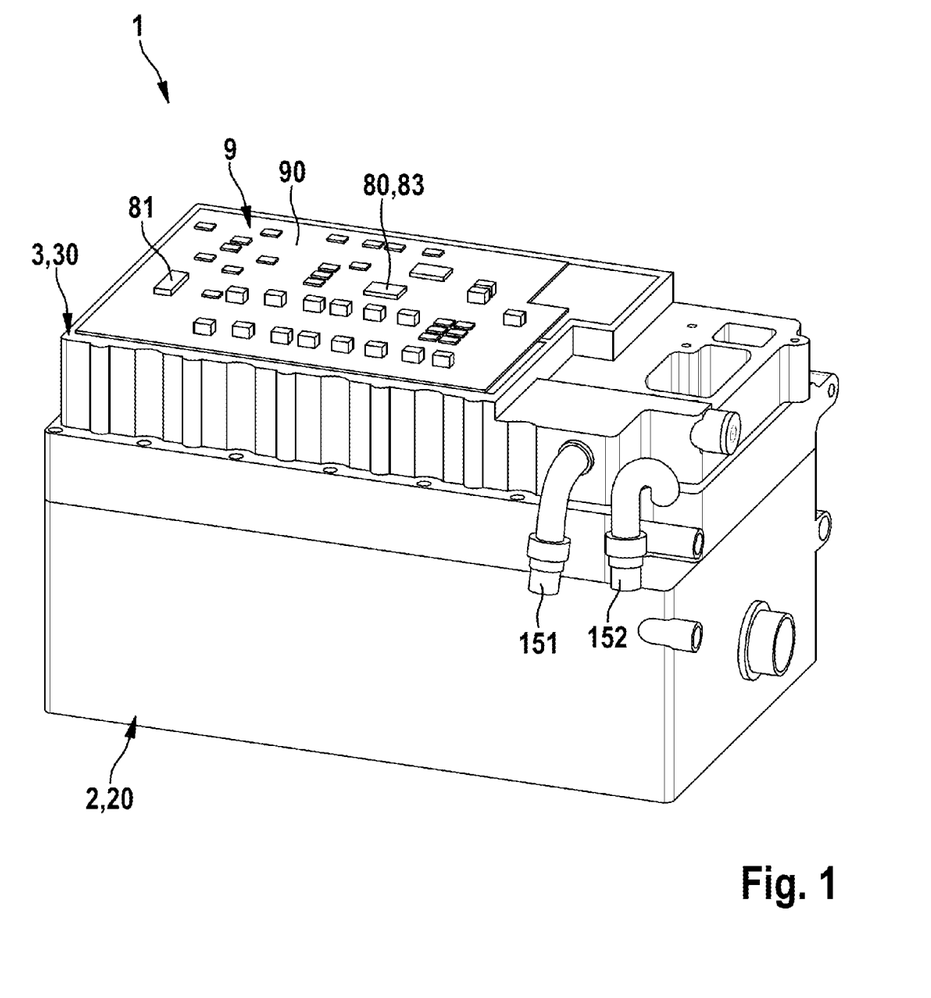
FIG. 1 shows an embodiment of a battery according to the invention in a perspective view.
Figure 2:
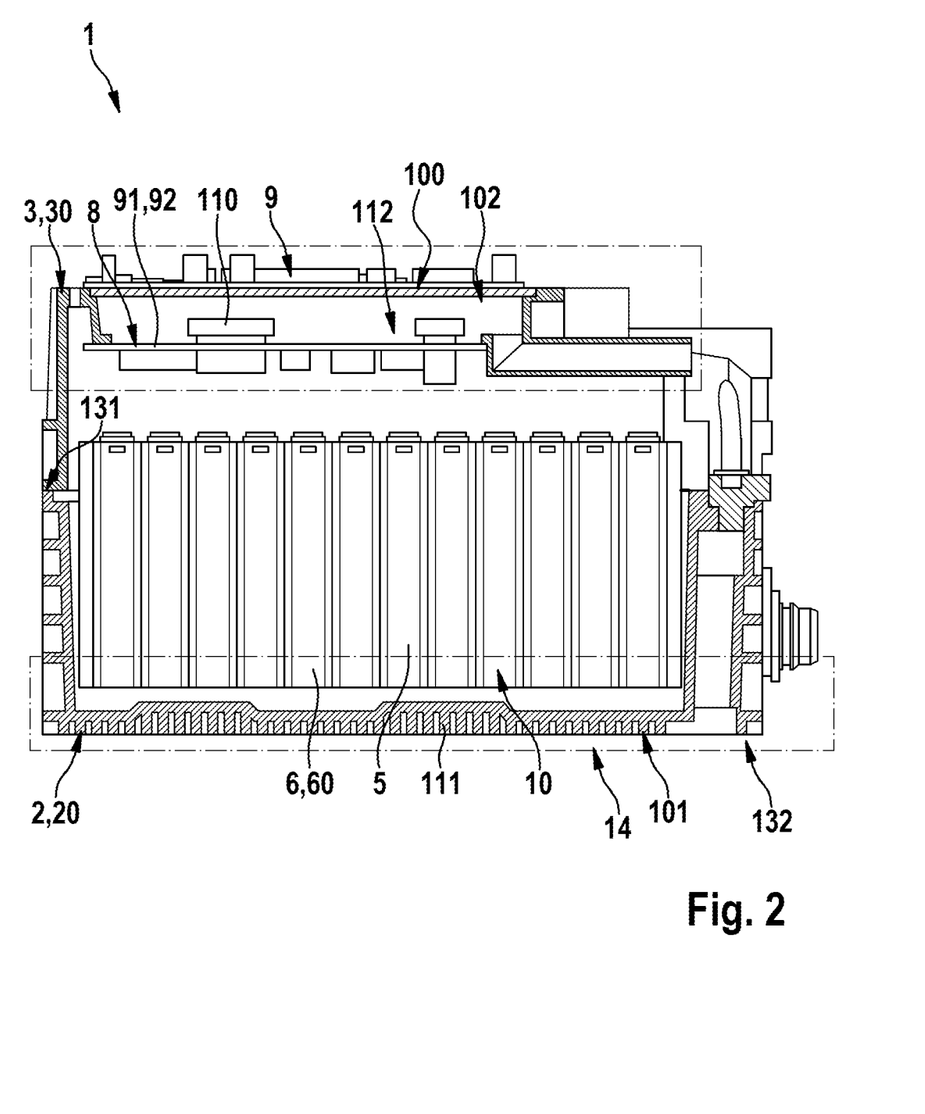
FIG. 2 shows the embodiment of a battery as per FIG. 1 in a sectional view.

FIG. 1 shows an embodiment of a battery 1 according to the invention in a perspective view. FIG. 2 shows this embodiment according to the invention of the battery 1 as per FIG. 1 in a sectional view. FIGS. 1 and 2 will now be described jointly.

The battery 1 comprises a first housing element 2 and a second housing element 3. In the embodiment of the battery 1 shown in FIGS. 1 and 2, the first housing element 2 is formed as a die-cast housing 20 and the second housing element 3 is formed as a die-cast housing 30.

The first housing element 2 and the second housing element 3 jointly form an interior space 5 for accommodating a battery module 10. The interior space 5 and the battery module 10 can be seen in particular in the sectional view in FIG. 2. In particular, the first housing element 2 and the second housing element 3 are connected to one another in fluid-tight form. For this purpose, a seal element 131 is arranged between the first housing element 2 and the second housing element 3. In particular, the first housing element 2 and the second housing element 3 may also be screwed to one another in order to form a reliable mechanical connection.

A multiplicity of battery cells 6 is accommodated in the interior space 5. The multiplicity of battery cells 6 of the battery module 10 is in this case connected in electrically conductive fashion to one another in series and/or in parallel. The multiplicity of battery cells 6 are preferably each formed as prismatic battery cells 60, as can be seen for example from FIG. 2.

The second housing element 3 forms a second temperature-control structure 102 on a side averted from the interior space 5. In particular, the second temperature-control structure 102 is arranged so as to be averted from the first housing element 2.

Furthermore, the battery 1 comprises a cover element 100, which is connected to the second housing element 3 such that the cover element 100 delimits a temperature-control fluid receptacle 112, which can be flowed through by temperature-control fluid, in fluid-tight fashion with respect to surroundings 5. Furthermore, the second temperature-control structure 102 is formed such that it can be flowed around by the temperature-control fluid.

The cover element 100 may in this case have a deformed portion for accommodating a second element 9 of the battery controller. In FIGS. 1 and 2, the cover element 100 is formed in a planar configuration from a metal.

Furthermore, a first element 8 of a battery controller is arranged in the interior space 5. The first element 8 of the battery controller is in this case arranged in thermally conductive contact against a side, facing toward the interior space 5, of the second housing element 3. In particular, the first element 8 of the battery controller may in this case be an electrical voltage converter 91, such as in particular a DC voltage converter 92.

The first housing element 2 forms a first temperature-control structure 101 on a side averted from the interior space 5. In particular in the embodiment as per FIGS. 1 and 2, the first temperature-control structure 101 is arranged on a side, averted from the second housing element 3, of the first housing element 2. Furthermore FIG. 2 also shows that a further cover element 14 is arranged on the first housing element 2. Here, the cover element 14 and the first housing element 2 jointly form a further temperature-control fluid receptacle 111, which can be flowed through by temperature-control fluid. The first temperature-control structure 101 is in this case arranged within the further temperature-control fluid receptacle 111. In particular, the cover element 14 may be connected cohesively to the first housing element 2. Here, a seal element 132 may furthermore preferably be arranged between the first housing element 2 and the cover element 14.

Here, as can be seen from FIG. 2, the multiplicity of battery cells 6 is arranged in thermally conductive contact with an inner side, arranged directly adjacent to the first temperature-control structure 101, of the interior space 5.

Furthermore, FIG. 1 in particular shows that the battery 1 has a first connector 151 and a second connector 152. The first connector 151 is in this case designed for feeding temperature-control fluid to the battery 1, and the second connector 152 is in this case designed for discharging temperature-control fluid from the battery 1. Here, the temperature-control fluid can flow through the battery 1 and in particular the further temperature-control fluid receptacle 111 and the temperature-control fluid receptacle 112 in series or in parallel.

Furthermore, the battery 1 comprises a second element 9 of the battery controller. The second element 9 of the battery controller is in this case arranged in thermally conductive contact against a side, averted from the interior space 5 and in particular from the second housing element 2, of the cover element 100.

The second element 9 of the battery controller may for example comprise an electrical component 80 of the battery module 10 and/or an electronic component 81 of the battery module 10. For example, the electrical components 8 may be lines 83 which conduct electrical current. For example, the electronic components 81 of the battery module 10 may be switches, fuse elements, battery control systems and/or resistors. The electronic components 81 are particularly preferably at least partially integrated into a circuit board 90, as can be seen from FIG. 2.

Figure 3:
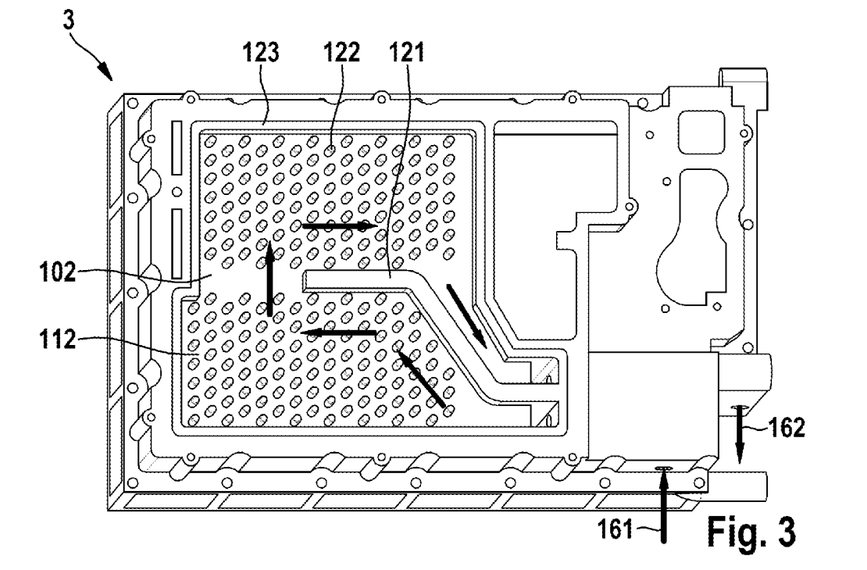
FIG. 3 shows a top side of a second housing element in a perspective view.

FIG. 3 shows a top side of a second housing element 3 of a battery 1 according to the invention in a perspective view. Here, the temperature-control fluid inlet 161 of the second housing element 3 can be seen, which is designed for admitting temperature-control fluid into the temperature-control fluid receptacle 112. Furthermore, here, the temperature-control fluid outlet 162 of the second housing element 3 can be seen. The second temperature-control fluid outlet 162 is designed for discharging temperature-control fluid out of the temperature-control fluid receptacle 112.

It is pointed out at this juncture that the temperature-control fluid inlet 161 may also form the first connector 151 of the battery 1, or may be connected in fluid-conducting fashion to the first connector 151, or that the temperature-control fluid outlet 162 may also form the second connector 152 of the battery 1, or may be connected in fluid-conducting fashion to the second connector 152.

Furthermore, FIG. 3 also shows that the second housing element 3 comprises the second temperature-control structure 102. Here, the second temperature-control structure 102 may comprise flow-guiding elements 121 which are designed to delimit the temperature-control fluid receptacle 112 such that the temperature-control fluid is guided correspondingly. Furthermore, the second temperature-control structure 102 may in this case comprise flow-disrupting elements 122 which are designed to increase the turbulence of the temperature-control fluid flowing through the temperature-control fluid receptacle 112. Furthermore, the second temperature-control structure 102 may also comprise flow-delimiting means 123 which delimit the temperature-control fluid receptacle 112 in fluid-tight fashion.

A guidance of flow within the temperature-control fluid receptacle 112 is schematically illustrated by the arrows indicated. In particular, the guidance of flow is in a U-shaped configuration.

It is already pointed out as this juncture that the cover element 100 is arranged such that the temperature-control fluid receptacle 112 is closed off in fluid-tight fashion with respect to surroundings 5. In particular, the cover element 100 may in this case be connected for example cohesively to the second housing element 3.

Figure 4:
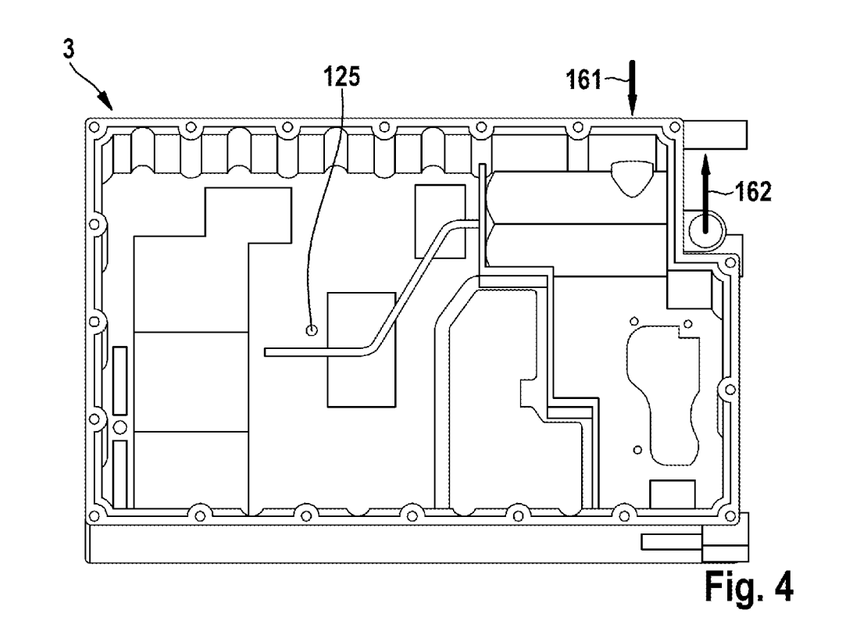
FIG. 4 shows a bottom side of the second housing element as per FIG. 3 in a perspective view.

FIG. 4 shows a bottom side of the second housing element 3 as per FIG. 3 in a perspective view. In particular, the temperature-control fluid inlet 161 of the second housing element 3 and the temperature-control fluid outlet 162 of the second housing element 3 are also shown here.

In particular, it is pointed out at this juncture that the first element 8 of the battery controller, for example the electrical voltage converter 91 or in particular the DC voltage converter 92, may be arranged directly in thermally conductive contact against the illustrated bottom side. For this purpose, the second housing element 3 may for example have screw connection points 125.

Figure 5:
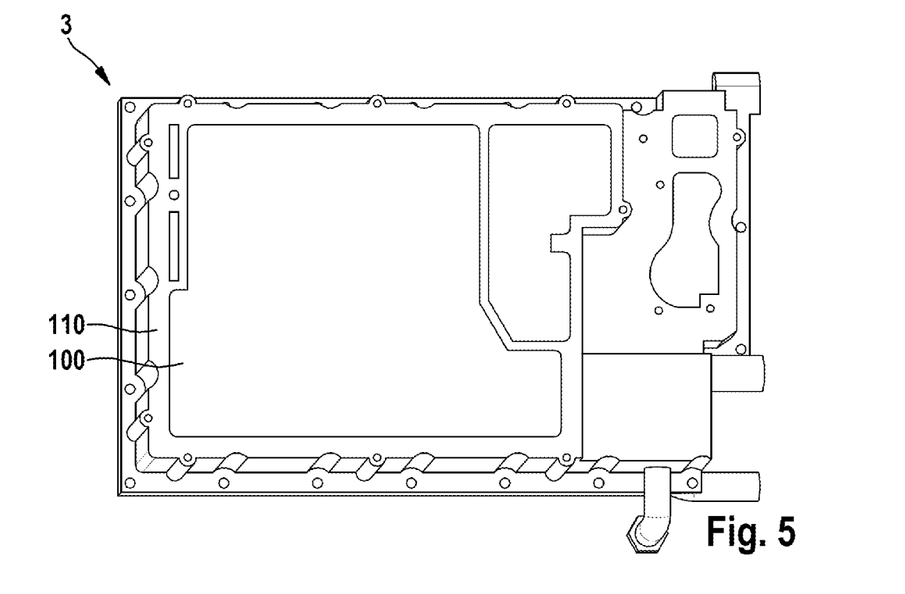
FIG. 5 shows a top side of a second housing element with a cover element in a perspective view.

FIG. 5 shows a top side of a housing element 3 according to the invention of a battery 1 according to the invention with a cover element 100 in a perspective view. In particular, the embodiment of the second housing element 3 corresponds to the embodiment as per FIG. 3. Here, the cover element 100 is connected to the second housing element 3 such that the cover element 100 delimits the temperature-control fluid receptacle 112 in fluid-tight fashion with respect to surroundings of the battery 1. In FIG. 5, the cover element 100 is formed from a metallic material. Furthermore, the cover element 100 is of planar configuration. Here, the cover element 100 is designed for the arrangement of the second element 9 of the battery controller, as can be seen for example also from FIG. 2.

Figure 6:
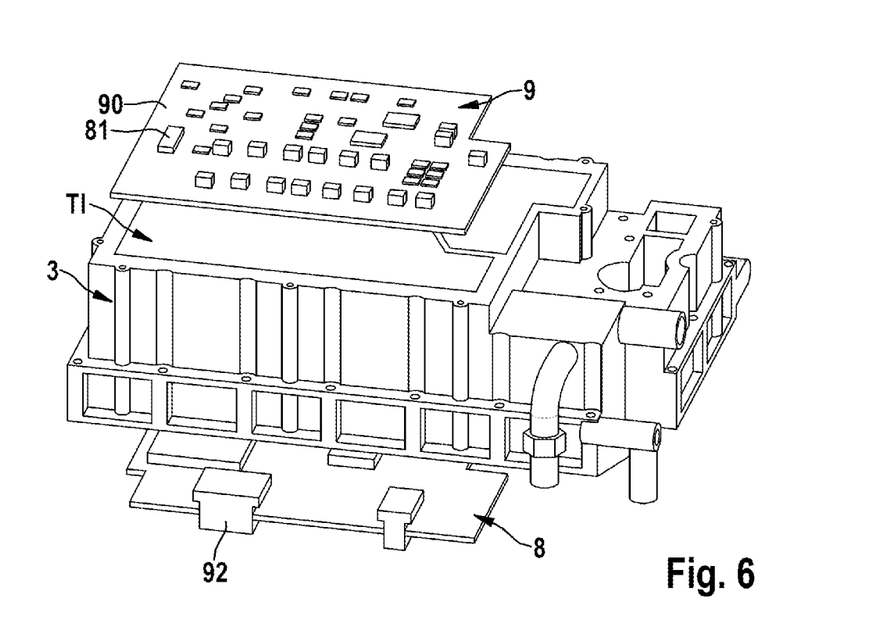
FIG. 6 shows a detail of a battery according to the invention in an exploded illustration.

FIG. 6 shows a detail of a battery 1 according to the invention in an exploded illustration.

Here, the second housing element 3 is shown.

It is also possible to see the second element 9 of the battery controller, which comprises an electronic component 81. Here, the electronic component 81 is integrated into a circuit board 90.

It can also be seen that the first element 8 of the battery controller is arranged on a side, facing toward the interior space 5, of the second housing element 3. Here, the first element 8 of the battery controller is in particular in the form of a DC voltage converter 92.

Here, the first element 8 of the battery controller may be connected to the second housing element 3 for example by means of the screw connection points 125 shown in FIG. 4.

Figure 7:
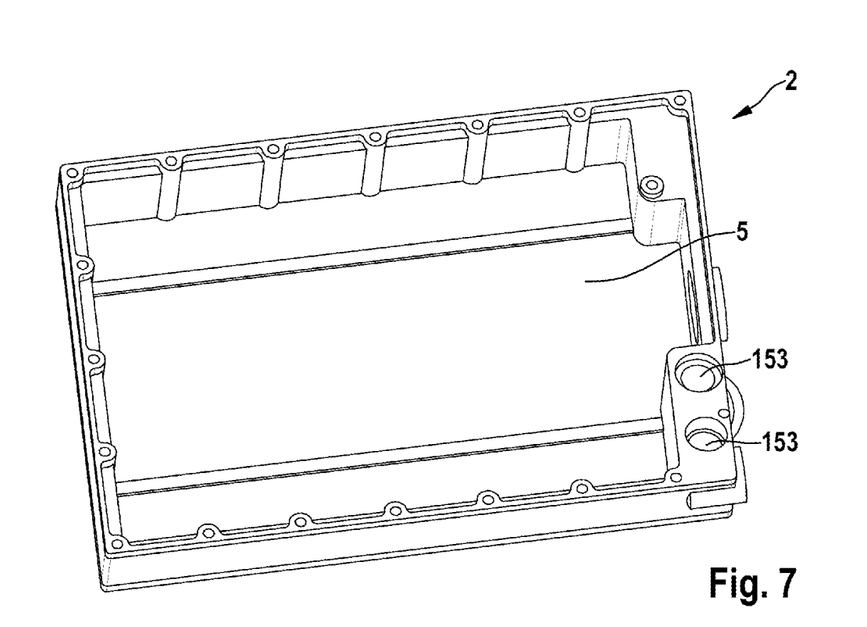
FIG. 7 shows a top side of a first housing element in a perspective view.

FIG. 7 shows a top side of a first housing element 2 in a perspective view. Here, it is possible to see in particular the interior space 5, which accommodates the multiplicity of battery cells 6, which are not visible in FIG. 7. Also shown are temperature-control fluid conduits 153 which are formed within the first housing element 2. The temperature-control fluid conduits 153 are designed to connect a temperature-control fluid inlet of the housing element to the temperature-control fluid outlet of the other housing element in fluid-conducting fashion, such that a parallel or series throughflow can be realized.

Figure 8:
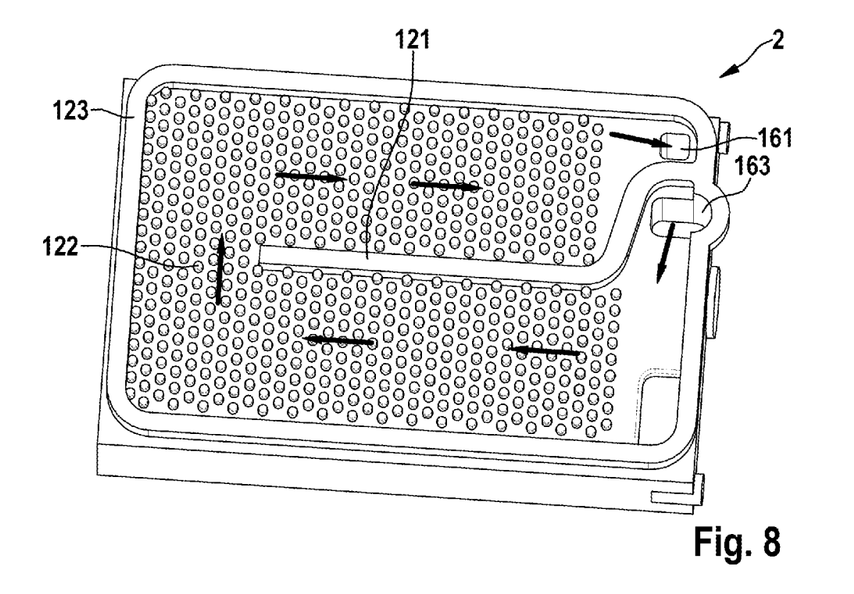
FIG. 8 shows a bottom side of a first housing element in a perspective view.

FIG. 8 shows a bottom side of the first housing element 2 as per FIG. 7 in a perspective view. Here, it is possible to see in particular the first temperature-control structure 101, which is arranged on a side, averted from the interior space 5, of the first housing element. Also shown are the temperature-control fluid inlet 163 of the further temperature-control fluid receptacle 111 and the temperature-control fluid outlet 164 of the further temperature-control fluid receptacle 111. The first temperature-control structure 101 is in this case in the form of flow-guiding elements 121, in the form of flow-disrupting elements 122 or in the form of flow-delimiting means 123. It is pointed out at this juncture that a further cover element 14, which is not visible in FIG. 8, is connected to the first housing element 2 such that the further cover element 14 delimits the further temperature-control fluid receptacle 111 in fluid-tight fashion with respect to surroundings.

What is claimed is:

1. A battery comprising
a first housing element (2) and a second housing element (3) which jointly form an interior space (5) for accommodating a battery module (10),
a multiplicity of battery cells (6), which are connected in electrically conductive fashion to one another in series and/or in parallel, arranged in the interior space (5),
a first element (8) of a battery controller, and
a second element (9) of the battery controller,
wherein the first element (8) is arranged in the interior space (5),
wherein the first housing element (2) forms a first temperature-control structure (101) on a side averted from the interior space (5),
wherein the second housing element (3) forms a second temperature-control structure (102) on a side averted from the interior space (5),
wherein a cover element (100) is connected to the second housing element (3),
wherein the cover element (100), the first element (8), and the second housing element (3) delimit a temperature-control fluid receptacle (112) configured to be flowed through by temperature-control fluid, and the second temperature-control structure (102) is configured to be flowed around by the temperature-control fluid,
wherein the cover element (100) is formed in a planar configuration from a metal,
wherein the second element (9) is positioned in contact with the cover element (100) on a side of the cover element (100) averted from the temperature-control fluid receptacle (112),
wherein a face of the first element (8) of the battery controller is arranged in thermally conductive contact against a face of the second housing element (3), and
wherein the face of the second housing element (3) faces toward the interior space (5).

2. The battery according to claim 1, characterized in that a face of the second element (9) of the battery controller is arranged in thermally conductive contact against a face, averted from the interior space (5), of the second housing element (3).

3. The battery according to claim 1, characterized in that the second element (9) of the battery controller comprises at least one electrical component (80) and/or at least one electronic component (81) of the battery module.

4. The battery according to claim 3, characterized in that the at least one electrical component (80) is a line (83), and in that the at least one electronic component (81) is a switch, a fuse element, a battery control system and/or a resistor.

5. The battery according to claim 3, characterized in that the second element (9) includes the at least one electronic component (81), and the at least one electronic component (81) is integrated onto a circuit board (90) that contacts the face of the second housing element (3).

6. The battery according to claim 3, characterized in that the first element (8) of the battery controller is an electrical voltage converter (91).

7. The battery according to claim 1, characterized in that the multiplicity of battery cells (6) is arranged in thermally conductive contact with a first inner side, arranged directly adjacent to the first temperature-control structure (101), of the interior space (5).

8. The battery according to claim 1, characterized in that the first housing element (2) and/or the second housing element (3) are each formed as die-cast housings (20, 30).

9. The battery according to claim 1, characterized in that the first housing element (2) and the second housing element (3) are connected to one another in fluid-tight form.

10. The battery according to claim 1, characterized in that a further cover element (14) is connected to the first housing element (2) such that the further cover element (14) delimits a further temperature-control fluid receptacle (111), which is configured to be flowed through by temperature-control fluid, in fluid-tight fashion with respect to surroundings, and the first temperature-control structure (101) is configured to be flowed around by the temperature-control fluid.

11. The battery according to claim 10, characterized in that the battery (1) comprises a first connector (151) configured for feeding temperature-control fluid to the battery (1) and comprises a second connector (152) configured for discharging temperature-control fluid from the battery (1), wherein the battery (1) has temperature-control fluid conduits (153) configured such that temperature-control fluid can flow through the temperature-control fluid receptacle (112) and the further temperature-control fluid receptacle (111) in series or in parallel.

12. The battery according to claim 1, characterized in that the first temperature-control structure (101) and/or the second temperature-control structure (102) are each formed as flow-guiding elements (121), as flow-disrupting elements (122) and/or as flow-delimiting means (123).

13. A battery comprising
a first housing element (2) and a second housing element (3) which jointly form an interior space (5) for accommodating a battery module (10),
a multiplicity of battery cells (6), which are connected in electrically conductive fashion to one another in series and/or in parallel, arranged in the interior space (5), wherein the multiplicity of battery cells (60) is of prismatic form,
a first element (8) of a battery controller, and
a second element (9) of the battery controller,
wherein the first element (8) is arranged in the interior space (5),
wherein the first housing element (2) forms a first temperature-control structure (101) on a side averted from the interior space (5) and from the second housing element (3),
wherein the second housing element (3) forms a second temperature-control structure (102) on a side averted from the interior space (5) and from the first housing element (2),
wherein a cover element (100) is connected to the second housing element (3),
wherein the cover element (100), the first element (8), and the second housing element (3) delimit a temperature-control fluid receptacle (112) configured to be flowed through by temperature-control fluid, and the second temperature-control structure (102) is configured to be flowed around by the temperature-control fluid,
wherein the cover element (100) is formed in a planar configuration from a metal,
wherein the second element (9) is positioned in contact with the cover element (100) on a side of the cover element (100) averted from the temperature-control fluid receptacle (112),
wherein a face of the first element (8) of the battery controller is arranged in thermally conductive contact against a face of the second housing element (3), and wherein the face of the second housing element (3) faces toward the interior space (5).

14. The battery according to claim 1, characterized in that a face of the second element (9) of the battery controller is arranged in thermally conductive contact against a face, averted from the interior space (5) and from the second housing element (3), of the second housing element (3).

15. The battery according to claim 2, characterized in that the first element (8) of the battery controller is a DC voltage converter (92).

16. The battery according to claim 1, characterized in that the first housing element (2) and the second housing element (3) are connected to one another in fluid-tight form, wherein a seal element (131) is arranged between the first housing element (2) and the second housing element (3).

17. The battery according to claim 1, characterized in that the face of the first element (8) of the battery controller is arranged in planar contact against the face of the second housing element (3).

18. The battery according to claim 13, characterized in that the face of the first element (8) of the battery controller is arranged in planar contact against the face of the second housing element (3).

\* \* \* \* \*